(12) United States Patent
Yim

(10) Patent No.: US 8,710,528 B2
(45) Date of Patent: *Apr. 29, 2014

(54) LIGHT EMITTING DEVICE

(75) Inventor: Jeong Soon Yim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 103 days.

This patent is subject to a terminal disclaimer.

(21) Appl. No.: 13/422,794

(22) Filed: Mar. 16, 2012

(65) Prior Publication Data

US 2012/0175591 A1    Jul. 12, 2012

Related U.S. Application Data

(63) Continuation of application No. 12/626,599, filed on Nov. 25, 2009, now Pat. No. 8,154,041.

(30) Foreign Application Priority Data

Nov. 26, 2008    (KR) .................. 10-2008-0117850

(51) Int. Cl.
*H01L 33/00*    (2010.01)

(52) U.S. Cl.
USPC .............. 257/98; 257/E33.063; 257/E33.064; 257/E33.065

(58) Field of Classification Search
USPC .................................... 257/E33.064
See application file for complete search history.

(56) References Cited

U.S. PATENT DOCUMENTS

| | | | |
|---|---|---|---|
| 6,900,473 B2 | 5/2005 | Yoshitake et al. | |
| 7,485,482 B2 | 2/2009 | Lee et al. | |
| 8,154,041 B2 * | 4/2012 | Yim .............................. | 257/98 |
| 2003/0222259 A1 | 12/2003 | Senda et al. | |
| 2005/0179130 A1 * | 8/2005 | Tanaka et al. ................. | 257/730 |
| 2005/0230699 A1 * | 10/2005 | Wu et al. ......................... | 257/98 |
| 2005/0287687 A1 | 12/2005 | Liao et al. | |
| 2008/0061304 A1 | 3/2008 | Huang et al. | |
| 2008/0230793 A1 | 9/2008 | Yoon et al. | |
| 2009/0127575 A1 | 5/2009 | Horng et al. | |

FOREIGN PATENT DOCUMENTS

| | | |
|---|---|---|
| CN | 1395321 A | 2/2003 |
| CN | 101009344 A | 8/2007 |
| JP | 2004-56088 A | 2/2004 |
| KR | 10-2003-0017462 A | 3/2003 |
| KR | 10-2006-0074389 A | 7/2006 |
| WO | WO 2007/091762 A1 | 8/2007 |

* cited by examiner

*Primary Examiner* — Daniel Whalen
(74) *Attorney, Agent, or Firm* — Birch, Stewart, Kolasch & Birch, LLP

(57) ABSTRACT

A light emitting device including a substrate, a first conductive semiconductor layer on the substrate, an active layer on the first conductive semiconductor layer, a second conductive semiconductor layer on the active layer, and a reflective layer under the substrate and including a light reflection pattern configured to reflect light emitted by the active layer in directions away from the reflective layer.

19 Claims, 3 Drawing Sheets

US 8,710,528 B2

LIGHT EMITTING DEVICE

CROSS-REFERENCE TO A RELATED APPLICATION

The present application is a Continuation of application Ser. No. 12/626,599, filed on Nov. 25, 2009, now U.S. Pat. No. 8,154,041 and claims priority under 35 U.S.C. 119 to Korean Patent Application No. 10-2008-0117850 filed on Nov. 26, 2008, which is hereby incorporated by reference in its entirety.

BACKGROUND OF THE INVENTION

1. Field of the Invention

The present invention relates to a light emitting device and a method of manufacturing the same.

2. Discussion of the Background

A light emitting diode (LED) uses a compound semiconductor to convert an electric signal into light. Thus, light emitting devices use the LED or produce light such as in small handheld devices like calculators, digital watches, etc. However, the LEDs generally only output a small amount of light and thus are used only in small electronic devices.

SUMMARY OF THE INVENTION

Accordingly, one object of the present invention is to address the above-noted and other problems of the related art.

Another object of the present invention is to provide a light emitting device with improved light emitting efficiency.

To achieve these and other advantages and in accordance with the purpose of the present invention, as embodied and broadly described herein, the present invention provides in one aspect a light emitting device including a substrate; a first conductive semiconductor layer on the substrate; an active layer on the first conductive semiconductor layer; a second conductive semiconductor layer on the active layer; and a reflective layer under the substrate and including a plurality of first projections configured to reflect light emitted by the active layer in directions away from the reflective layer, wherein an upper surface of the reflective layer has a width wider than that of an lower surface of the active layer.

In another aspect, the present invention provides a light emitting device including a reflective layer; a first conductive semiconductor layer on the reflective layer; a substrate between the reflective layer and the first conductive semiconductor layer; an active layer on the first conductive semiconductor layer; a second conductive semiconductor layer on the active layer; a first electrode on the first conductive semiconductor layer; and a second electrode on the second conductive semiconductor layer, wherein the reflective layer includes a plurality of first projections projecting from the reflective layer, wherein the reflective layer includes a metal layer and is formed of a planer layer.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Reference will now be made in detail to the preferred embodiments of the present invention, examples of which are illustrated in the accompanying drawings.

Figure 1:
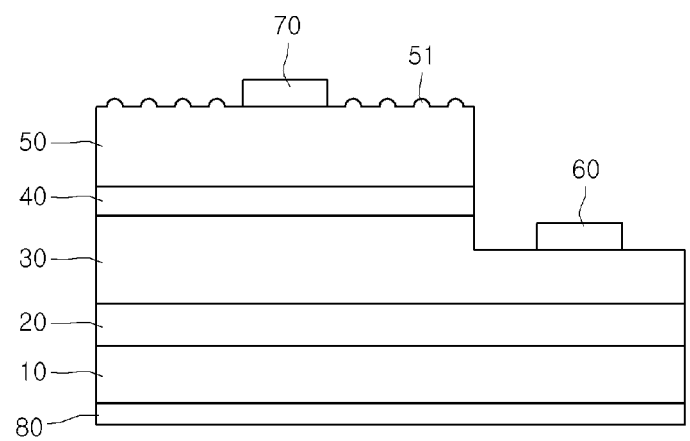
FIG. 1 is a cross-sectional view illustrating a light emitting device according to a first embodiment of the present invention.

FIG. 1 is a cross-sectional view illustrating a light emitting device according to a first embodiment of the present invention. As shown, the light emitting device includes a substrate 10, a Un-doped GaN layer 20 formed on the substrate 10, a first conductive semiconductor layer 30 formed on the Un-doped GaN based-layer 20, an active layer 40 formed on the first conductive semiconductor 30, and a second conductive semiconductor layer 50 formed on the active layer 40.

The light emitting device also includes a first electrode layer 60 on the first conductive semiconductor layer 30 and a second electrode layer 70 on the second conductive semiconductor layer 50. In addition, the first conductive semiconductor layer 30 may be an n-type semiconductor and the second conductive semiconductor layer 50 may be a p-type semiconductor layer and vice versa. Thus, the light emitting device emits light from the active layer 60 by being supplied with power through the electrodes 60 and 70.

In addition, in the embodiment shown in FIG. 1, the substrate 10 may be formed of at least one of sapphire ($Al_2O_3$), Si, SiC, GaAs, ZnO or MgO. A buffer layer with a stacked structure such as AlInN/GaN, $In_xGa_{1-x}$N/GaN, $Al_xIn_yGa_{1-x-y}$N/$In_xGa_{1-x}$N/GaN, etc., may also be formed between the substrate 10 and the Un-doped GaN layer 20. Further, the substrate 10 can be a growth substrate for growing the Un-doped GaN layer 20, the first conductive semiconductor layer 30, the active layer 40 and the second conductive semiconductor layer 50.

In addition, the Un-doped GaN based-layer 20 can be grown by injecting trimethyl gallium (TMGa) gas into a chamber together with nitrogen gas, hydrogen gas and ammonium gas. Also, the first conductive semiconductor layer 30 may be a nitride semiconductor layer into which a first conductive impurity ion is implanted. For example, the first conductive semiconductor layer 30 may be a semiconductor layer into which an n-type impurity ion is implanted. Further, the first conductive semiconductor layer can be grown by injecting trimethyl gallium (TMGa) gas and silane ($SiH_4$) gas including an n-type impurity (for example, Si) into the chamber together with hydrogen gas and ammonia gas.

In addition, the active layer 40 may be formed of a single quantum well structure, a multi-quantum well structure, a quantum-wire structure and a quantum dot structure. For example, the active layer 40 may be formed of a stacked structure of an InGaN well layer/GaN barrier layer.

Also, the second conductive semiconductor layer 50 may be a nitride semiconductor layer into which the second conductive impurity ion is implanted. For example, the second conductive semiconductor layer 50 may be a semiconductor layer into which a p-type impurity ion is implanted. The second conductive semiconductor layer 50 can be grown by injecting trimethyl gallium (TMGa) gas and bicetyl cyclo pentadienyl (EtCp$_2$Mg) {Mg(C$_2$H$_5$C$_5$H$_4$)$_2$} including p-type impurity (for example, Mg) into the chamber together with hydrogen gas and ammonia gas.

Further, the first embodiment of the present invention advantageously forms a reflective layer 80 under the substrate 10 and a light extraction pattern 51 on the upper surface of the second conductive semiconductor layer 50 to improve a light extraction efficiency in the light emitting device.

In more detail, the reflective layer 80 may be formed of at least one of titanium (Ti), chromium (Cr), nickel (Ni), aluminum (Al), platinum (Pt), gold (Au) or silver (Ag). Thus, the light emitted from the active layer 40 and that traveled in a direction towards the substrate is reflected by the reflective layer 80 and emitted upward from the light emitting device. Therefore, the light extraction efficiency of the light emitting device is improved.

In addition, the light extraction pattern 51 formed on the upper surface of the second conductive semiconductor layer 50 further increases the light emission efficiency of the device. That is, light that cannot be emitted to the outside due to a high refractive index of the second conductive semiconductor layer 50 is extracted to the outside via the light extraction pattern 51.

Further, in the embodiment shown in FIG. 1, the light extraction pattern 51 has a hemispherical shape. However, the pattern 51 can be formed in various other shapes of projections or grooves such as a cylindrical shape, a cone shape, a random shape, etc. In the embodiment shown in FIG. 1, the hemispherical shape of the patterns 51 preferably has a radius of 1.5 μM. In addition, the light extraction pattern 51 may be formed by selectively removing the second conductive semiconductor layer 50 or selectively growing the second conductive semiconductor layer 50.

Thus, as described above, the light emitting device in the first embodiment includes the reflective layer 80 under the substrate 10 and the light extraction pattern 51 on the second conductive semiconductor layer 50 such that light generated from the active layer 40 can be effectively extracted to the outside.

Figure 2:
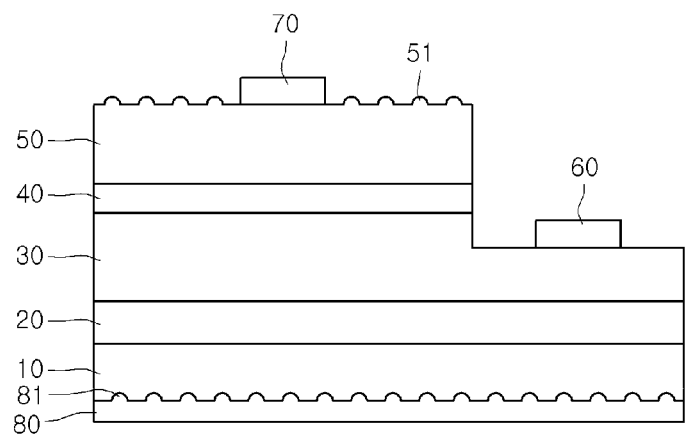
FIG. 2 is a cross-sectional view illustrating a light emitting device according to a second embodiment of the present invention.

Next, FIG. 2 is a cross-sectional view illustrating a light emitting device according to a second embodiment of the present invention. Also, in describing the light emitting device according to the following additional embodiments, the same elements described in the first embodiment will not be repeated in detail.

Referring to FIG. 2, the light emitting device includes the substrate 10, the Un-doped GaN based-layer 20 formed on the substrate 10, the first conductive semiconductor layer 30 formed on the Un-doped GaN layer 20, the active layer 40 formed on the first conductive semiconductor layer 30, and the second conductive semiconductor layer 50 formed on the active layer 40. Further, the light emitting device includes the first electrode layer 60 on the first conductive semiconductor layer 30 and the second electrode layer 70 on the second conductive semiconductor layer 50.

Also, to improve the light extraction efficiency, the reflective layer 80 is formed under the substrate 10 and the light extraction pattern 51 is formed on the upper surface of the second conductive semiconductor layer 50. To further improve the light emission efficiency of the device, a light scattering pattern 81 is formed on the reflective layer 80. Also, in this embodiment, the light scattering pattern 81 is formed on the upper surface of the reflective layer 80. In addition, the scattering pattern 81 is illustrated as being formed in a hemispherical shape, but may be formed in various shapes of projections or grooves such as a cylindrical shape, a cone shape, a random shape, etc.

The light scattering pattern 81 selectively etches the lower surface of the substrate 10 to form the projections and grooves and may be almost naturally formed on the upper surface of the reflective layer 80 by forming the reflective layer 80 under the substrate 10. The light scattering pattern 81 may also be disposed on the same horizontal plane with the substrate 10.

Figure 3:
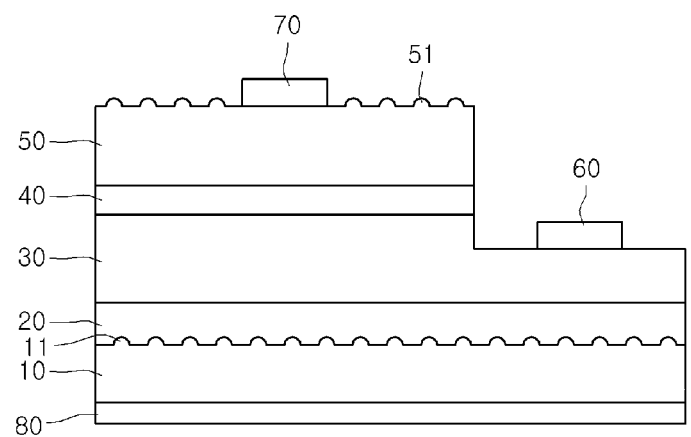
FIG. 3 is a cross-sectional view illustrating a light emitting device according to a third embodiment of the present invention.

Next, FIG. 3 is a cross-sectional view illustrating a light emitting device according to a third embodiment of the present invention. Referring to FIG. 3, the light emitting device includes the substrate 10, the Un-doped GaN layer 20 formed on the substrate 10, the first conductive semiconductor layer 30 formed on the Un-doped GaN layer 20, the active layer 40 formed on the first conductive semiconductor layer 30, and the second conductive semiconductor layer 50 formed on the active layer 40.

Further, the light emitting device includes the first electrode layer 60 on the first conductive semiconductor layer 30 and the second electrode layer 70 on the second conductive semiconductor layer 50. The reflective layer 80 is also formed under the substrate 10 and the light extraction pattern 51 is formed on the upper surface of the second conductive semiconductor layer 50. Further, a light scattering pattern 11 is formed on the substrate 10 to further improve the light emission efficiency of the device.

The light scattering pattern 11 is also formed on the upper surface of the substrate 10, and is illustrated as being formed in a hemispherical shape, but may be formed in various shapes of projections or grooves such as a cylindrical shape, a cone shape, a random shape, etc. In addition, the light scattering pattern 11 may be formed by selectively etching the upper surface of the substrate 10, and may be disposed on the same horizontal plane with the un-doped GaN layer 20.

Figure 4:
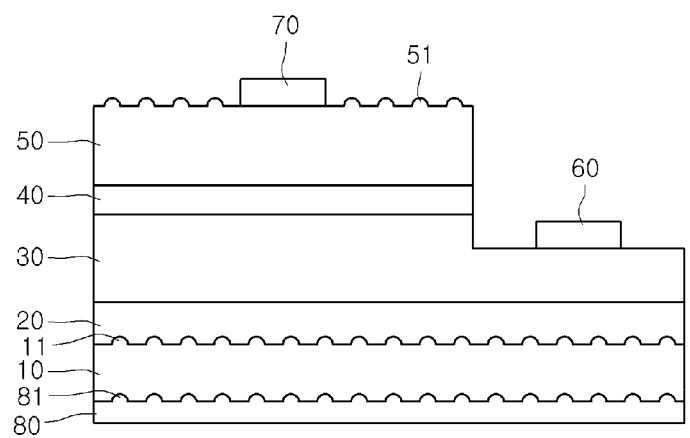
FIG. 4 is a cross-sectional view illustrating a light emitting device according to a fourth embodiment of the present invention.

Next, FIG. 4 is a cross-sectional view illustrating a light emitting device according to a fourth embodiment of the present invention. Referring to FIG. 4, the light emitting device includes the substrate 10, the un-doped GaN layer 20 formed on the substrate 10, the first conductive semiconductor layer 30 formed on the Un-doped GaN layer 20, the active layer 40 formed on the first conductive semiconductor layer 30, and the second conductive semiconductor layer 50 formed on the active layer 40.

Further, as shown, the light emitting device includes the first electrode layer 60 on the first conductive semiconductor layer 30, and the second electrode layer 70 on the second conductive semiconductor layer 50. Also, to further improve the light emission efficiency, the device also includes the reflective layer 80 having the light scattering pattern 81, the light extraction pattern 51 formed on the upper surface of the second conductive semiconductor layer 50, and the light scattering pattern 11 formed on the substrate 10.

Figure 5:
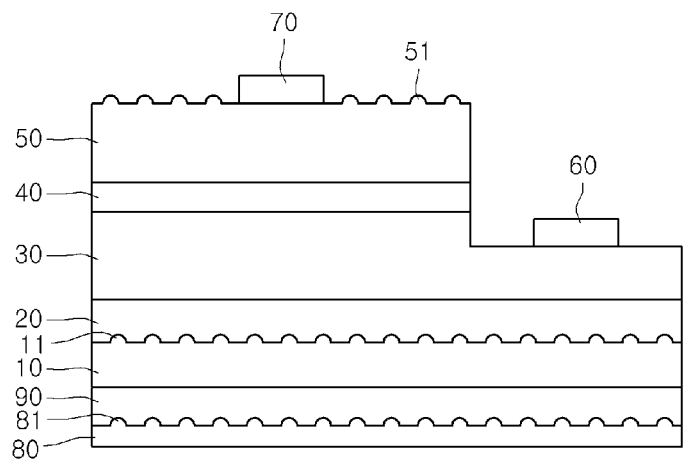
FIG. 5 is a cross-sectional view illustrating a light emitting device according to a fifth embodiment of the present invention.

Next, FIG. 5 is a cross-sectional view illustrating a light emitting device according to a fifth embodiment of the present invention. Referring to FIG. 5, the light emitting device includes the substrate 10, the Un-doped GaN layer 20 formed on the substrate 10, the first conductive semiconductor layer 30 formed on the Un-doped GaN layer 20, the active layer 40 formed on the first conductive semiconductor layer 30, and the second conductive semiconductor layer 50 formed on the active layer 40.

Further, the light emitting device includes the first electrode layer 60 on the first conductive semiconductor layer 30 and the second electrode layer 70 on the second conductive semiconductor layer 50. Also included is the reflective layer 80 having the light scattering pattern 81 formed under the substrate 10, the light extraction pattern 51 formed on the upper surface of the second conductive semiconductor layer 50, and the light scattering pattern 11 formed on the substrate 10.

However, the light emitting device according to the fifth embodiment includes a resin layer 90 such as an epoxy under the substrate 10 and disposes the reflective layer 80 having the light scattering pattern 81 under the resin layer 90. The resin layer 90 may be a material having a refractive index similar to the substrate 10. The resin layer 90 can also be processed easier than the substrate 10 such that the projections or grooves are formed in a desired form on the lower surface of the resin layer 90, making it possible to easily form the light scattering pattern 81. The light scattering pattern 81 is also disposed on the same horizontal plane with the resin layer 90.

Figure 6:
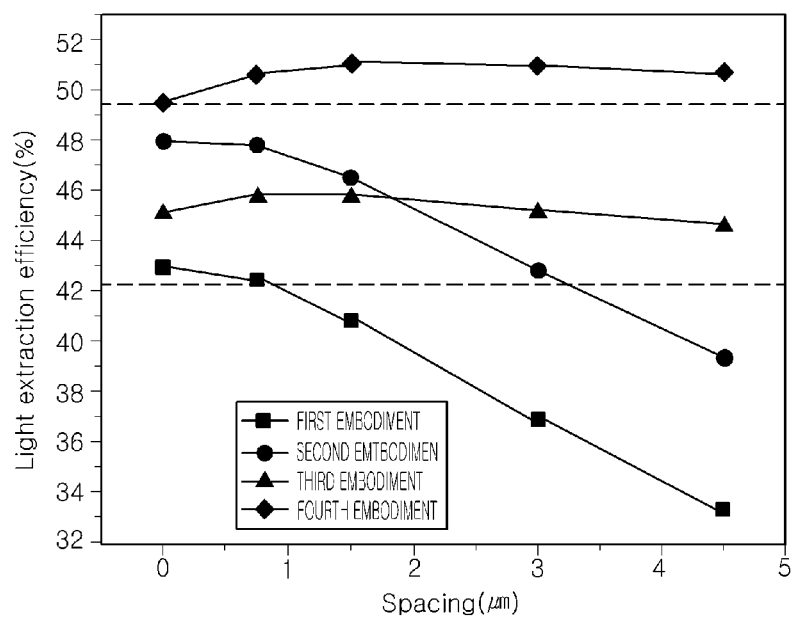
FIG. 6 is a graph illustrating a light extraction efficiency of a light emitting device according to the embodiments of the present invention.

Next, FIG. 6 is graph illustrating the light extraction efficiency for the light emitting device according to the embodiments of the present invention. As shown in FIG. 6, the light extraction efficiency of the light emitting device according to the second embodiment is higher than that of the light emitting device according to the first embodiment. That is, it can be seen that the second light extraction pattern 81 formed on the reflective layer 80 improves the light extraction efficiency.

Further, the light extraction efficiency of the light emitting device according to the third embodiment is higher than the light extraction efficiency of the light emitting device according to the first embodiment. Therefore, it can be seen that the third light extraction pattern 11 formed on the substrate 10 improves the light extraction efficiency.

Further, the light extraction efficiency of the light emitting device according to the fourth embodiment is higher than the light extraction efficiency of the light emitting device according to the first, second and third embodiments. Therefore, when the light scattering pattern 11 is formed on the substrate and the light scattering pattern 81 is formed on the reflective layer 80, it can be seen that the light extraction efficiency is maximized.

Also, in FIG. 6, the X axis indicates an interval between the light extraction patterns 51 formed on the second conductive semiconductor layer 50. Thus, it can be seen that the light extraction efficiency is changed according to the light extraction patterns 51. Meanwhile, at least one of the light extraction pattern 51, the light scattering pattern 81, or the light scattering pattern 11 may be formed in the light emitting device. For example, the light extraction pattern 51 and the light scattering pattern 11 may not be formed in the light emitting device and only the light scattering pattern 81 may be formed in the light emitting device.

Further, in the description of the above-embodiments of the present invention, when each layer (or film), an area, a pattern or structures are described to be formed "on" or "under" each layer (or film), the area, the pattern or the structures, each layer (or film), an area, a pattern or structures can be formed by being directly contacted to each layer (or film), the area, the pattern or the structures and the other layer (or film), other area, other pattern or other structures are additionally formed therebetween. Also, being "on" or "under" each layer is described based on the drawings.

Further, in the drawings, the thickness or size of each layer is exaggerated or schematically illustrated for the convenience and clarity of explanation. Also, the size of each constituent does not necessarily reflect its actual size.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a substrate;
a first conductive semiconductor layer on the substrate;
an active layer on the first conductive semiconductor layer;
a second conductive semiconductor layer on the active layer;
a reflective layer under the substrate and including a plurality of first projections configured to reflect light emitted by the active layer in directions away from the reflective layer; and
a plurality of second projections on the substrate,
wherein an upper surface of the reflective layer has a width wider than that of a lower surface of the active layer,
wherein an entire lower surface of the reflective layer is located at a lower position than that of a lower surface of the substrate, and
wherein the reflective layer is formed of a metal layer and is directly contacted with the lower surface of the substrate.

2. The light emitting device according to claim 1, further comprising a GaN based-layer between the substrate and the first conductive semiconductor layer.

3. The light emitting device according to claim 1, further comprising a plurality of third projections on the second conductive semiconductor layer.

4. The light emitting device according to claim 3, wherein the plurality of third projections is upwardly projected from an upper surface of the second conductive semiconductor layer.

5. The light emitting device according to claim 1, wherein the plurality of second projections is upwardly projected from an upper surface of the substrate.

6. The light emitting device according to claim 1, wherein the plurality of first projections is upwardly projected from the upper surface of the reflective layer.

7. The light emitting device according to claim 6, wherein the substrate includes a plurality of grooves and each of the plurality of first projections is disposed in each of the grooves.

8. The light emitting device according to claim 1, wherein the reflective layer is formed of a single layer.

9. The light emitting device according to claim 1, wherein the substrate is formed of a material of sapphire ($Al_2O_3$), and
wherein the upper surface of the reflective layer has a same width as that of the lower surface of the substrate.

10. The light emitting device according to claim 1, wherein the lower surface of the reflective layer is located at a lower position than the upper surface of the reflective layer.

11. The light emitting device according to claim 1, wherein each of the plurality of first projections is vertically overlapped with each of the plurality of second projections.

12. A light emitting device, comprising:
a reflective layer;
a first conductive semiconductor layer on the reflective layer;
a substrate disposed between the reflective layer and the first conductive semiconductor layer;
a resin layer disposed between the reflective layer and the substrate;
an active layer on the first conductive semiconductor layer;
a second conductive semiconductor layer on the active layer;
a first electrode on the first conductive semiconductor layer; and
a second electrode on the second conductive semiconductor layer,
wherein the reflective layer includes a plurality of first projections projecting from an upper surface of the reflective layer,
wherein the reflective layer includes a metal layer,
wherein the resin layer is contacted with the substrate and the reflective layer,
wherein the resin layer is located at a lower position than a lower surface of the substrate, and
wherein an entire lower surface of the reflective layer is located at a lower position than that of the lower surface of the substrate.

13. The light emitting device according to claim 12, wherein the upper surface of the reflective layer has a same width as that of the lower surface of the substrate, and
wherein the plurality of first projections are located at a lower position than the lower surface of the substrate.

14. The light emitting device according to claim 13, wherein the substrate is formed of a material of Si.

15. The light emitting device according to claim 12, wherein the reflective layer is formed of a single layer and comprises at least one of titanium (Ti), chromium (Cr), nickel (Ni), aluminum (Al), platinum (Pt), gold (Au) and silver (Ag).

16. The light emitting device according to claim 12, wherein a lower surface of the resin layer has a plurality of grooves and each of the plurality of first projections is disposed in each of the grooves.

17. The light emitting device according to claim 16, further comprising a plurality of second projections projected upwardly from an upper surface of the substrate and vertically overlapped with a center location of the first projections, respectively.

18. A light emitting device, comprising:
a reflective layer;
a first conductive semiconductor layer on the reflective layer;
a substrate between the reflective layer and the first conductive semiconductor layer;
a resin layer disposed between the reflective layer and the substrate;
an active layer on the first conductive semiconductor layer;
a second conductive semiconductor layer on the active layer;
a light extraction pattern on the second conductive semiconductor layer;
a first electrode on the first conductive semiconductor layer; and
a second electrode on the second conductive semiconductor layer,
wherein the reflective layer includes a light reflective pattern projecting from a surface of the reflective layer,
wherein the reflective layer covers an entire lower surface of the substrate,
wherein the reflective layer includes a metal layer,
wherein the resin layer is contacted with the substrate and the reflective layer, and
wherein the light reflective pattern is located at a lower position than the entire lower surface the substrate.

19. The light emitting device according to claim 18, wherein the substrate includes a light scattering pattern projecting from an upper surface of the substrate, wherein the light scattering pattern has a same interval as that of the reflective pattern, and
wherein a projection of the light scattering pattern is overlapped with a projection of the reflective pattern.

* * * * *